United States Patent [19]

Burke et al.

[11] Patent Number: 5,356,513

[45] Date of Patent: Oct. 18, 1994

[54] POLISHSTOP PLANARIZATION METHOD AND STRUCTURE

[75] Inventors: Peter A. Burke, Milton, Vt.; Michael A. Leach, Milpitas, Calif.

[73] Assignee: International Business Machines Corporation, Armonk, N.Y.

[21] Appl. No.: 51,915

[22] Filed: Apr. 22, 1993

[51] Int. Cl.⁵ .................. H01L 21/44; H01L 21/465
[52] U.S. Cl. ...................................... 156/636; 437/195
[58] Field of Search ............... 156/636; 437/225, 228; 51/281 R, 283 R

[56] References Cited

U.S. PATENT DOCUMENTS

| | | | |
|---|---|---|---|
| 3,911,562 | 10/1975 | Youmans . | |
| 4,523,372 | 6/1985 | Balda et al. | 156/646 |
| 4,545,852 | 10/1985 | Barton | 156/643 |
| 4,663,832 | 5/1987 | Jambotkar | 29/576 |
| 4,671,851 | 6/1987 | Beyer et al. | 156/645 |
| 4,744,861 | 5/1988 | Matsunaga et al. | 156/643 |
| 4,775,550 | 10/1988 | Chu et al. | 427/38 |
| 4,784,721 | 11/1988 | Holmen et al. | 156/647 |
| 4,789,648 | 12/1988 | Chow et al. | 437/225 |
| 4,836,885 | 6/1989 | Breiten et al. | 156/643 |
| 4,843,033 | 6/1989 | Plumton et al. | 437/161 |
| 4,843,034 | 6/1989 | Herndon et al. | 437/189 |
| 4,874,463 | 10/1989 | Koze et al. | 156/645 |
| 4,874,464 | 10/1989 | Goodwin et al. | 156/646 |
| 4,879,257 | 11/1989 | Patrick | 437/195 |
| 4,885,261 | 12/1989 | Yoshikawa | 437/228 |
| 4,910,155 | 3/1990 | Cote et al. | 437/8 |
| 4,940,509 | 7/1990 | Tso et al. | 156/653 |
| 4,944,836 | 7/1990 | Beyer et al. | 156/645 |
| 4,956,313 | 9/1990 | Cote et al. | 437/203 |
| 4,962,063 | 10/1990 | Maydan et al. | 437/228 |
| 4,964,946 | 10/1990 | Gray et al. | 156/643 |
| 4,981,550 | 1/1991 | Huttemann et al. | 156/643 |
| 5,064,683 | 11/1991 | Poon et al. | 51/281 R |
| 5,077,234 | 12/1991 | Scoopo et al. | 437/67 |
| 5,084,419 | 1/1992 | Sakao | 437/228 |
| 5,169,491 | 12/1992 | Doan | 156/636 |

FOREIGN PATENT DOCUMENTS

| | | |
|---|---|---|
| 0223920 | 3/1987 | European Pat. Off. . |
| 52-35980 | 3/1977 | Japan . |
| 63-266830 | 11/1988 | Japan . |

OTHER PUBLICATIONS

"Planarization Process using Spin-On-Glass and Polishing", Research Disclosure-32635, Jun. 1991, p. 404.

W. E. Mutter, "Choice Stop Material for Chemical-/Mechanical Polish Planarization", IBM Tech. Disc. Bull., vol. 27, No. 8, Jan. 1985, p. 4642.

K. D. Bayer et al., "Glass Planarization by Stop-Layer Polishing", IBM Tech. Disc. Bull., vol. 27, No. 8, Jan. 1985 p. 4700.

A. P. Ho et al., IBM Technical Disclosure Bulletin, vol. 24, No. 7A: 3389-3392 (Dec. 1981).

W. K. Chu et al., IBM Technical Disclosure Bulletin, vol. 24 No. 9: 4734-4735 (Feb. 1982).

Primary Examiner—Brian E. Hearn
Assistant Examiner—Lynne A. Gurley
Attorney, Agent, or Firm—Heslin & Rothenberg

[57] ABSTRACT

The invention provides a method for producing a substantially planar surface overlying features of a semiconductor structure. The method comprises forming alternating layers of a hard polishing material and a soft polishing material over the features of the semiconductor structure, and then polishing the alternating layers to form a substantially planar surface over the features. The method takes advantage of the polish rates of the various materials used as alternating layers to enhance the planarization process.

24 Claims, 4 Drawing Sheets

POLISHSTOP PLANARIZATION METHOD AND STRUCTURE

TECHNICAL FIELD

This invention relates to a planarization method and structure, more particularly to a method which utilizes polishstops to create a substantially planar surface. In the method, alternating layers of hard and soft polishing materials are utilized to take advantage of their respective polish rates so that planarization of the alternating layers is enhanced or controlled.

BACKGROUND ART

Integrated circuits generally have a system of metallized interconnects which couple the various devices fabricated in a semiconductor substrate. Typically, aluminum or some other metal is deposited and then patterned to form interconnect paths along the surface of the silicon substrate. In most processes, a dielectric or insulative layer is then deposited over this first metal layer, via openings are etched through the dielectric layer, and a second metallization layer is deposited. The second metal layer covers the dielectric layer and fills the via openings, thereby making electrical contact down to the first metal layer. The purpose of the dielectric layer is to act as an insulator between the first metal layer and the second metal layer interconnects.

Most often, the intermetal dielectric layer comprises a chemical vapor deposition (CVD) of silicon dioxide. This silicon dioxide layer covers the first metal interconnects conformably so that the upper surface of the silicon dioxide layer is characterized by a series of non-planar steps which correspond in height to the underlying first metal lines.

These step-heights in the upper surface of the interlayer dielectric have several undesirable features. First, a non-planar dielectric surface interferes with the optical resolution of subsequent photolithographic processing steps. This makes it extremely difficult to print high resolution lines. A second problem involves the step coverage of the second metal layer over the interlayer dielectric. If the step height is too large, there is a serious danger that open circuits will be formed in the second metal layer.

To combat these problems, various techniques have been developed in an attempt to better planarize the upper surface of the interlayer dielectric. One approach, known as chemical mechanical polishing, employs abrasive polishing to remove the protruding steps along the upper surface of the dielectric. According to this method, the silicon substrate is placed face down on a table covered with a pad which has been coated with an abrasive material, also known as a polishing compound or slurry. Both the wafer and the table are then rotated relative to each other to remove the protruding portions. This abrasive polishing process continues until the upper surface of the dielectric layer is largely flattened.

Current all-polish planarization schemes are severely limited because polish rates are strong functions of feature sizes. For any polishing pad, narrow down areas polish more slowly than wide down areas, which are slower than wide up areas, which are slower than narrow up areas. "Down" areas refer to recessed portions of the semiconductor structure, and "up" areas refer to raised portions of the semiconductor structure. Up areas are often formed by the metallization lines referred to above, leaving the unoccupied silicon substrate surface as the down area. "Wide" up areas often occur as a result of a dense array pattern of metallization, while "narrow" up areas occur as a result of isolated metallization lines. Achieving a final planarized surface becomes a balancing act between several different polish rates and initial thicknesses of these wide and narrow up and down features.

Current back end of line (BEOL) planarization processes use either a simple dielectric polish or add a hard top polish layer. Modelled results for one example of an all oxide polish are shown in Table 1. This data is for a specific process with a specific pad. For the all oxide polish, a balancing act between the polishing non-uniformities and the feature size polish rate dependencies exist. Wider down areas planarize much more slowly than narrower down areas. More material must be removed to achieve planarity. When the step height associated with the 0.1 mm down feature is reduced to 1390 Angstroms, the differences in step heights between 0.1 and 0.5 mm down features exceed 1000 Angstroms with 20,000 Angstroms of material removed, leaving 2300 Angstroms of topographical variation due to typical polishing non-uniformities. Clearly, this simple oxide polishing process is not effective for planarization for down area feature sizes greater than 0.1 mm.

TABLE 1

| Modelling results for a simple oxide polish (Suba 500) | | | | | |
|---|---|---|---|---|---|
| | Step Height $[= A]^4$ | | | | |
| | Down Area Distance $[= mm]$ | | | | |
| Amt Pol[1] | 0.1 | 0.5 | 1.5 | 3-sigma[2] | down range[3] |
| 1000 | 7329 | 7571 | 7753 | 120 | 424 |
| 3000 | 6153 | 6783 | 7284 | 360 | 1131 |
| 6000 | 4732 | 5751 | 6632 | 720 | 1900 |
| 10000 | 3334 | 4615 | 5852 | 1200 | 2518 |
| 15000 | 2153 | 3505 | 5006 | 1800 | 2853 |
| 20000 | 1390 | 2662 | 4282 | 2400 | 2892 |
| 40000 | 241 | 886 | 2292 | 4800 | 2051 |
| 75000 | 11 | 129 | 767 | 9000 | 756 |

[1] Amount of material polished and/or removed from up-area
[2] 3-sigma polishing uniformity of 12% in amount of expected variation
[3] Variation in down area step heights from 1.5 mm to .1 mm
[4] Step height calculated from model for down area dimensions and amounts removed as noted In regard to placing a hard upper layer on the polished material, this offers a significant improvement. This process does not control dishing over wide metal lines, however, as no polishstop is present in these areas. Therefore, this process does not allow for over polishing to eliminate the approximate 2500 Angstroms of incurred polishing non-uniformities, in addition to feature size dependencies discussed above.

In addition, simple polish planarization processes cannot deal with diverse metallization densities, such as where wide unpatterned areas cover half of the chip and dense patterns cover the other half. For these applications, such single polish planarization processes will fail because non-planarities accumulate from level to level leading to such problems as tungsten puddling and problems associated with long contact and via overetches. This results in difficulties in photolithography, film deposition over steps, and via etching.

Thus, in spite of attempts at obtaining globally planarized surfaces, a need still exists for a method of obtaining such planarized surfaces while overcoming the problems discussed above.

DISCLOSURE OF INVENTION

This need is met, and the problems of the prior methods overcome, by the methods and structures of the subject invention. Briefly, the invention provides a method for producing a substantially planar surface over features of a semiconductor structure. The features include raised and recessed portions, for example metal lines and trenches. Alternating layers of a hard polishing material and a soft polishing material are formed over the features of the semiconductor structure. These alternating layers are then polished so as to create the substantially planar surface. The polishing takes advantage of the different polish rates of the alternating layers to achieve such global substantial planarity as an end result. The structures of the invention are used to enhance the properties of a chemical mechanical polish to enhance planarity and allow control of the polishing process.

Suitable soft polishing materials include dielectrics, such as silicon dioxide, phosphosilicate glass (PSG), borophosphosilicate glass (BPSG), sputtered quartz, and polyimide. Suitable hard polishing materials include silicon nitride, silicon carbide, diamond like carbon, alumina, tungsten, and silicon dioxide. Silicon dioxide can be used as the hard polishing material when the soft polishing material is BPSG or PSG. "Hard" and "soft" polishing materials as used herein derive meaning in the context of being relative to one another. A hard polishing material polishes more slowly than a soft polishing material, under similar polishing conditions.

The invention also provides a substantially planar surface formed by alternating layers of hard and soft polishing materials which surround tungsten vias. The top surface of the filled vias forms a portion of the planar surface, eliminating problems such as tungsten puddling.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

As mentioned previously, the broad concept of the subject invention is directed to a method for producing a substantially planar surface overlying features of a semiconductor structure. The method provides for planarity enhancement and/or control by utilizing chemical-mechanical polishing of at least three alternating layers of hard and soft materials, e.g. hard-soft-hard or soft-hard-soft, over the interlayer dielectric. As conformal layers, the hard and soft layers each rise and fall with the contour of the semiconductor structure. This creates up and down areas of each hard and soft layer.

To understand the concept of the subject invention, consider alternating hard/soft/hard layers. The hard layer overlying the interlayer dielectric is considered a buried polishstop layer. This polishstop layer allows for an overpolish without reverse dishing problems, so that planarity can be achieved. The upper hard layer is of a thickness such that it will remain in the widest "down" areas when planarization is achieved. The middle soft layer is of a thickness to align the top and bottom layers, allowing for overpolish.

The embodiment described in the above paragraph is known as the "leveling internal polishstop". This embodiment utilizes a buried polishstop layer in conjunction with a hard upper layer, to obtain enhanced planarization.

Figure 1:
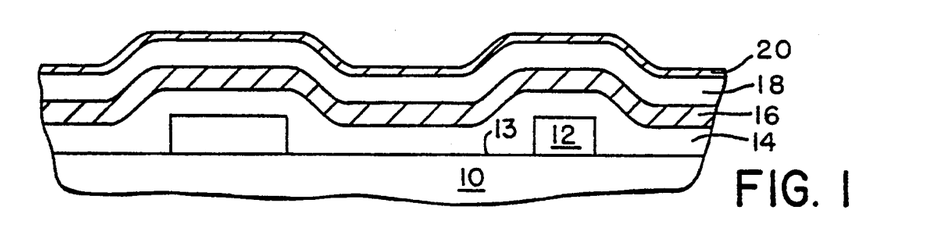
FIG. 1 is a cross-section side elevational view of an initial structure according to one embodiment of the subject invention.

Referring to FIG. 1, the "leveling internal polishstop" starting structure consists of hard/soft/hard layers overlying the interlayer dielectric of a semiconductor structure. The semiconductor substrate 10 as shown has metal lines 12 on its surface. The alternating layers of hard and soft polishing materials overlie interlayer dielectric 14 covering the metal lines 12 and surface 13 of the substrate 10. Sequentially from top to bottom, the alternating layers comprise a hard polishing material 20, a soft polishing material 18, and a hard polishing material 16 overlying the interlayer dielectric 14. In this embodiment, the hard polishing material 16 acts as the buried polishstop layer to prevent overpolishing or reverse dishing. This allows for enhancement of planarization. For some applications, the hard polishing material 16 and interlayer dielectric 14 may be combined into one layer, provided the material polishes significantly slower than the other soft polishing material 18 above it.

Figure 2:
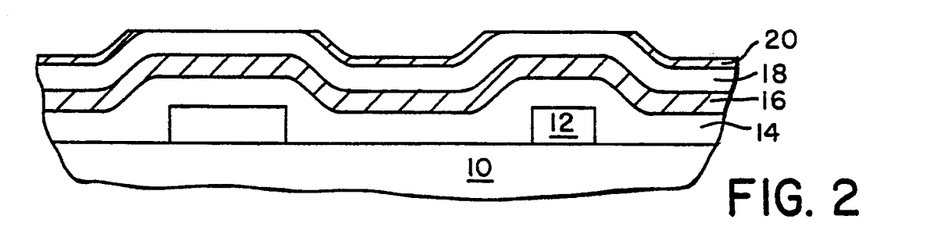
FIG. 2 is a cross-section side elevational view of the structure shown in FIG. 1 after polishing to remove portions of the top slowly polishing material.
Figure 3:
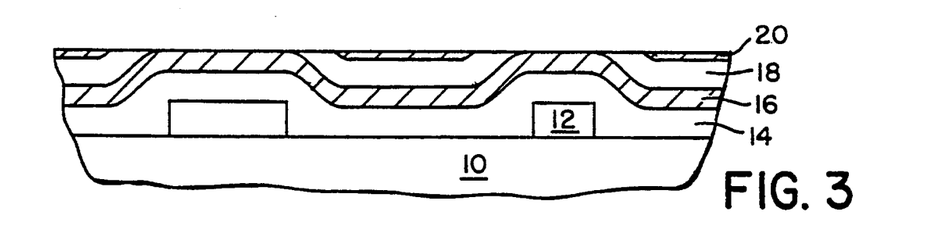
FIG. 3 is a cross-section side elevational view of the structure shown in FIG. 2 after further polishing to remove the dielectric overlying the metal lines.

As shown in FIG. 2, the hard polishing material 20 has been polished away over the raised features, i.e. the metal lines 12. This exposes the underlying layer of soft polishing material 18 overlying the raised features. Polishing is continued to remove the soft polishing material 18 overlying the raised features, so that the hard polishing material 16 is exposed (see FIG. 3). At this time, the hard polishing material 20 overlying the recessed areas and the hard polishing material 16 overlying the raised areas form a substantially planar surface.

Figure 4:
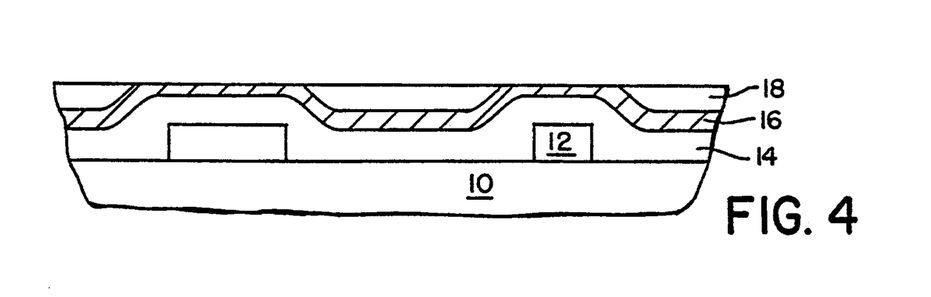
FIG. 4 is a cross-section side elevational view of the structure shown in FIG. 3 after further polishing or wet etching to remove the remaining slowly polishing material.

FIG. 4 shows an optional embodiment in which the remaining hard polishing material 20 has been removed by polishing or wet etching. This results in the soft polishing material 18 overlying the recessed areas and the hard polishing material 16 overlying the raised areas forming the substantially planar surface.

A more detailed discussion of the embodiment shown in FIGS. 1–4 is provided below. For the purposes of the discussion, the following materials will be used: the top hard polishing material will be silicon nitride, the top soft polishing material will be PSG, and the lower hard polishing material and interlayer dielectric will be combined into one silicon dioxide film.

In the first polish step, the top silicon nitride layer acts to maintain the selectivity between the up and down area polish rates. Silicon nitride polishes 4–5 times more slowly than PSG. Consequently, the step between the up and down areas is effectively maintained while an equivalent of 4 times as much PSG has been removed. This minimizes the polish rate of the down areas.

This polishstep can be modelled quantitatively to evaluate the polishing performance and to establish the necessary film thickness of slowly polishing materials and of the polishstop. A semi-empirical model was used, which incorporates dishing data, in conjunction with the understanding that relative polish rates of up and down features are a linear function of the step height between features.

Figure 5:
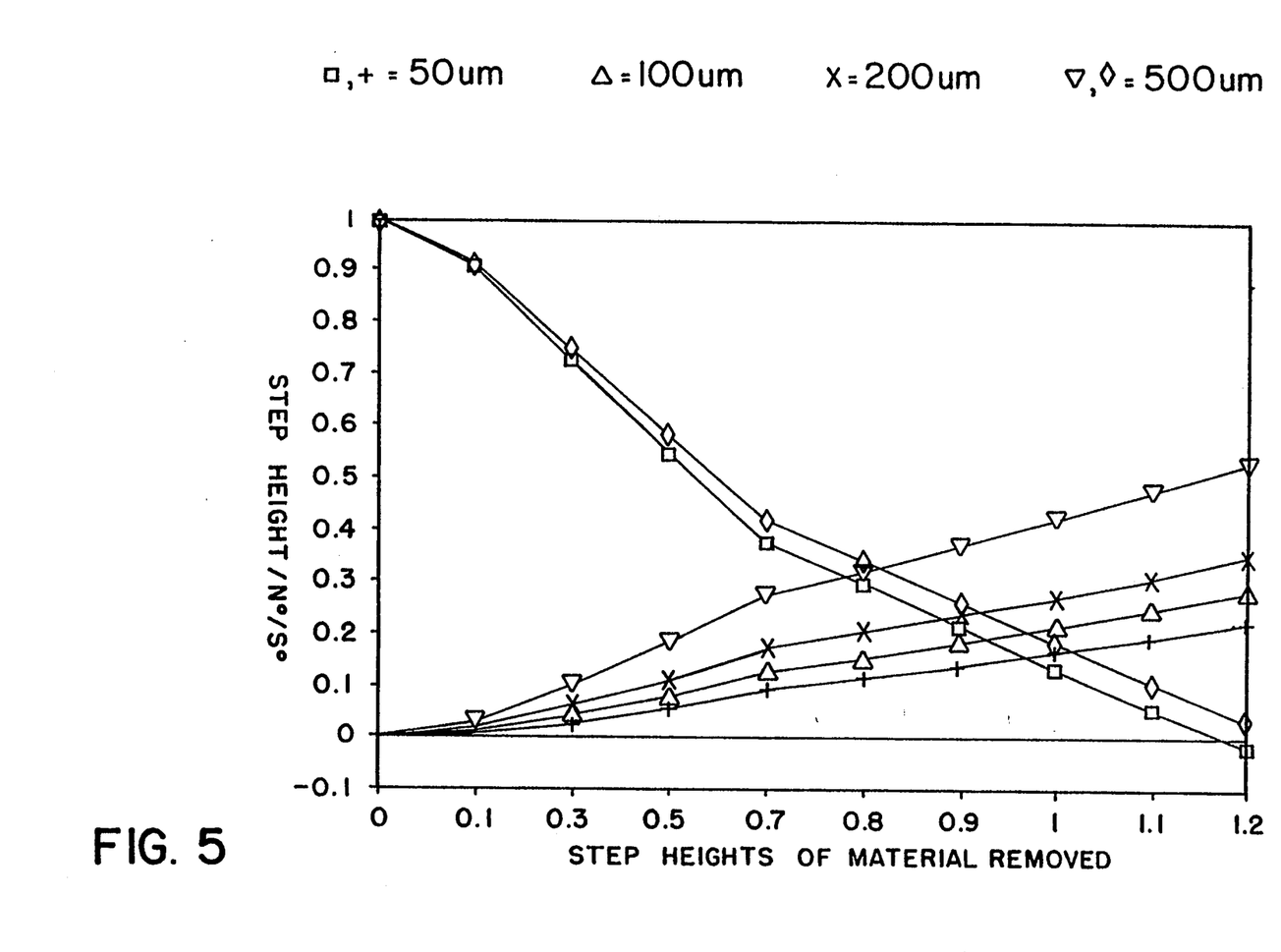
FIG. 5. shows step height and required silicon nitride as a function of feature size and the amount of dielectric removed, normalized to initial step height.

Modelled results presented in FIG. 5 show graphically the reduction in step height for four down area feature sizes relative to a wide up area as a function of the amount of material removed (after the hard upper layer has been polished off of the features and assuming that the polish stop remains in all the down areas). The lower plot shows the required amount of silicon nitride consumed during the polish in the down areas. Silicon nitride well in excess of 2000 Angstroms is necessary for feature sizes of 500 μm or greater, for this characterized CMP process. Differences in the amount of silicon nitride consumed as a function of feature size severely limit the final planarity of the structure.

For processing, step heights of 8000 Angstroms are typical. With 2500 Angstroms of silicon nitride and 8000 Angstroms of PSG being removed during the polish, and approximately 14% 3-sigma polishing uniformity, 2500 Angstroms of surface non-uniformity will result. To compensate, an overpolish is necessary. Because silicon dioxide polishes 40% slower than PSG, 750 Angstroms of additional silicon dioxide should be added as a polishstop. The resulting structure will consist of, from bottom to top: 3750 Angstroms of silicon dioxide, 7250 Angstroms of PSG, and 2500 Angstroms of silicon nitride. The final surface above the lower topography will be planar to +/−750 Angstroms in addition to the non-uniformities discussed above.

This modeling data is for a specific process and a specific pad, and represents one example of the enhancement of planarity. The method of the subject invention can be used with any polishing process to enhance the performance of the planarization process. For example, if a planarization process can achieve a range of 2 mm, that process can be enhanced to obtain a range of 5 mm. If another planarization process can achieve a range of 5 mm, the process can be enhanced utilizing the method of the subject invention to achieve a range of 8 mm, for example. Thus, the modeling example given is merely to illustrate the enhancement of the planarization obtainable with the given process and pad by utilizing the method of the subject invention.

In a further embodiment of the subject invention, known as the "sacrificial oxide and polishstop", the range of planarity achievable with the "leveling internal polishstop" is extended. This is accomplished by using polishing to selectively reveal up area films (hard layers), then selectively removing the hard layer and polishing to planarity. Polishing is first used to expose an upper buried hard polishstop layer over "up" areas of the semiconductor structure. A selective etch is then used to remove the upper hard polishstop over the "up" areas without etching of the underlying soft polishing material. A second polish then removes the soft polishing material, leaving the upper hard polishstop over the "down" areas and the lower hard polishstop over the "up" areas. A planar surface results.

Figure 6:
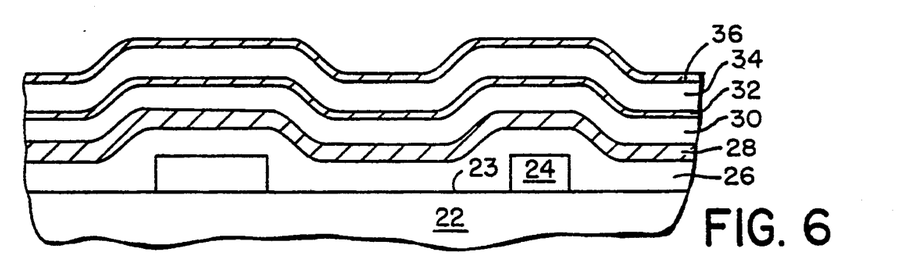
FIG. 6 is a cross-section side elevational view of an initial structure according to a further embodiment of the subject invention.
Figure 7:
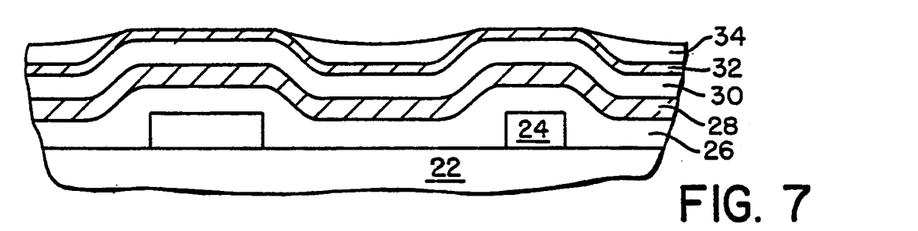
FIG. 7 is a cross-section side elevational view of the structure shown in FIG. 6 after the first polishing to remove the top slowly polishing material and the underlying dielectric overlying the metal lines.
Figure 8:
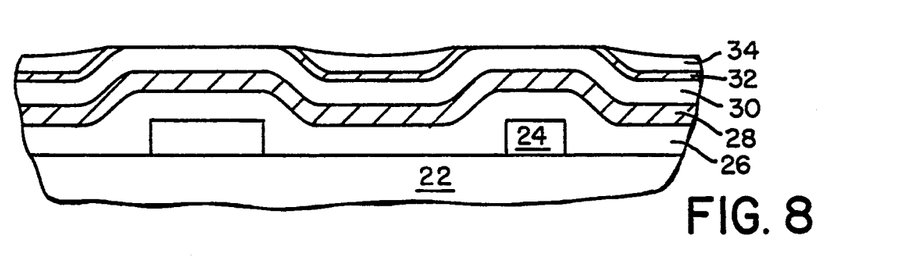
FIG. 8 is a cross-section side elevational view of the structure shown in FIG. 7 after a selective dip to remove the exposed polishstop.
Figure 9:
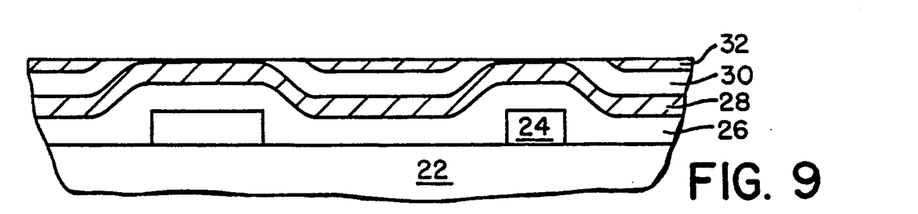
FIG. 9 is a cross-section side elevational view of the structure shown in FIG. 8 after a second polish to remove the dielectrics.
Figure 10:
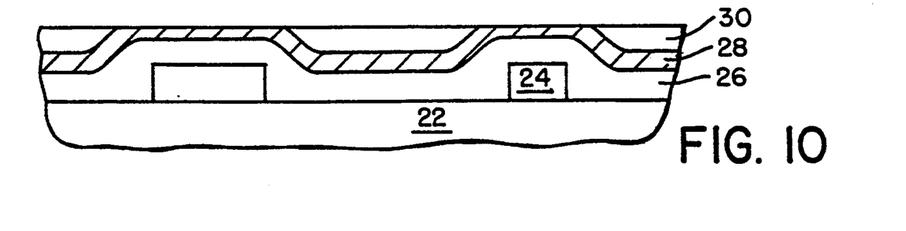
FIG. 10 is a cross-section side elevational view of the structure shown in FIG. 9 after further polishing or wet etching to remove the exposed polishstop.

Referring to FIG. 6, the "sacrificial oxide polishstop" starting structure consists of hard/soft/hard/soft/hard layers overlying the interlayer dielectric of a semiconductor structure. The semiconductor substrate 22 as shown has metal lines 24 on its surface 23. The alternating layers of hard and soft polishing materials overlie interlayer dielectric 26 covering the metal lines 24 and surface 23 of the substrate 22. The starting structure consists of a sacrificial first hard polishstop 36, soft polishing material layers 30 and 34, and hard polishing material layers 28 and 32 overlying the interlayer dielectric 26. Examples of combinations of common materials which can be used for each alternating layer are outlined in Table 2.

TABLE 2

Model of Step Height for Current Polishing Art
Possible Dielectric/Polishstop/Selective dip
Combinations Top level/Slowly polishing materials
$Si_3N_4$, Diamond like Carbon Second level down

| Dielectric | Polishstop | Selective Dip |
|---|---|---|
| PSG, TEOS, $SiO_2$ | $Si_3N_4$ | Hot Phosphoric Acid |
| PSG, TEOS, BPSG, $SiO_2$ | $Al_2O_3$ | Nitric Acid |

Bottom Layers

| Dielectric | Polishstop |
|---|---|
| PSG | $SiO_2$ |
| PSG, BPSG, TEOS, $SiO_2$ | $Si_3N_4$ |

A more detailed discussion of the embodiment shown in FIGS. 6–10 is provided below. For the purposes of the discussion, the following materials will be used: the first two hard polishstops 32 and 36 are silicon nitride and PSG is used for the dielectric 26 and the soft polishing material layers 30 and 34. The final polishstop 28 will be silicon dioxide. The structure is polished to remove the hard polishing material 36 and the soft polishing material 34 overlying the raised features. Polishing continues until the tops of the polishstop layer 32 are exposed (see FIG. 7), while the down areas remain covered by PSG due to the relative polish rates of up and down areas. Next, the exposed polish stop 32 is selectively removed (see FIG. 8) and the structure is polished flat using both the silicon dioxide final polishstop 28 and the silicon nitride polishstop 32 as polishstops (see FIG. 9). An optional step can then be used to selectively remove the remaining silicon nitride polishstop 32 by polishing or wet etching techniques (see FIG. 10).

Critical to the above described process is the understanding that the maximum allowable dishing length or range for the above mentioned process is on the order of 2 mm for the modelled example given, which is large for the dimensions common to logic chip down areas compared to the 0.1 mm range in the same modelled process discussed in the background. The second polish uses the remaining silicon nitride and silicon dioxide as polish stops. After this polish, the silicon nitride is removed selectively and the silicon dioxide remains. For subsequent RIE processing for interlevel contacts and vias, silicon dioxide and PSG etch nearly identically.

In the first polish step, the top silicon nitride layer acts to maintain the selectivity between up and down area polish rates. Silicon nitride polishes 4 times more slowly than silicon dioxide. Consequently, the step between the up and down areas is effectively maintained while an equivalent of 4 times as much silicon dioxide has been removed, thus minimizing the polish rate of the down areas.

The dimensions or range at which this invention will provide substantial planarization can be calculated using process characterization curves [Burke, VLSI Metallization and Interconnect Conference Proceedings, pp. 379–383 (1991)]. Calculations are made by first calculating the ratio between "up" and "down" polish rates where the first buried polish stop/hard layer will be exposed after the first polish. This "critical ratio" can be calculated, as governed by the following equation:

$$\text{Critical ratio} = [1-(Ox_{top}/FT)]/(1+unif/2)^2.$$

$Ox_{top}$ is the critical amount of oxide which is required to protect the polish stop layer from the subsequent removal step and FT and unif represent the thickness of the top nitride/dielectric layers and the polishing uniformity respectively. A down area with more than $Ox_{top}$ of dielectric left over the polish stop before the selective removal step will be protected from dishing in the subsequent polish. With approximately 14% 3 sigma uniformity, using a 7% overpolish and 160 nm of silicon nitride and 300 nm of silicon dioxide, a ratio of down to up area polish rates must be 0.85 or less to leave 30 nm of oxide. Given this critical ratio, the process characterization curve is used to translate the ratio into a range for the given process. For a Suba-500 pad (see Burke reference), the largest allowable "down" area would be in excess of 3.6 mm. This critical ratio data is for the process illustrated. As with the modeling example, the equation can be utilized with other polishing processes to determine the range attainable with a particular characterized process and pad combination.

However, most chip designs do not have large unpatterned up areas, but instead have large patterned areas which polish faster than the model systems. Allowances for array patterning need to be made for processing and computing critical ranges. Arrays with pattern factors less than 1 after deposition will give faster "up" rates and hence enhance the performance of the invention.

The second polish step is timed to remove the dielectric over the final polishstop. This process has polishstop in the down area and polishstop above the lower topography (metal lines), which allows for a significant over-polish to combat polishing non-uniformities with little risk of reverse dishing in both the down areas and the areas above the lower topography. This feature ends the balancing act common for prior art planarization processes and allows for a more manufacturable process. The Sacrificial oxide and polishstop process as described in this Example will consistently leave the same amount of dielectric above the lower topography.

The advantages of this embodiment of the subject invention thus include the ability to achieve a planar surface to within 1000 Angstroms in a reproducible and controllable fashion with minimal risk of reverse dishing or of over/underpolishing (which are common problems for current planarization processes). The method will also work for chip patterns which represent the realm of possible logic designs, while current art will fail to meet a 1000 Angstroms planarization goal. Current polishing art cannot planarize effectively for down area dimensions greater than 0.5 mm while models and experimental results demonstrate that the subject invention planarizes effectively in excess of 2 mm, for the example given. As discussed above, this enhancement of planarity is attainable with other polishing processes. In relative terms, a "poor" polishing process can be enhanced to a "fair" polishing process, or a "fair" polishing process can be enhanced to a "good" process. Similarly, a "good" polishing process can be enhanced to a "great" polishing process.

In an additional embodiment of the subject invention, known as "tungsten-interlevel dielectric and stud with a leveling internal polishstop planarization", planarity is controlled to convert a "down" area having residual tungsten to an "up" area. This allows for polishing to a planar surface without polishing away tungsten studs, while eliminating residual tungsten.

Figure 11:
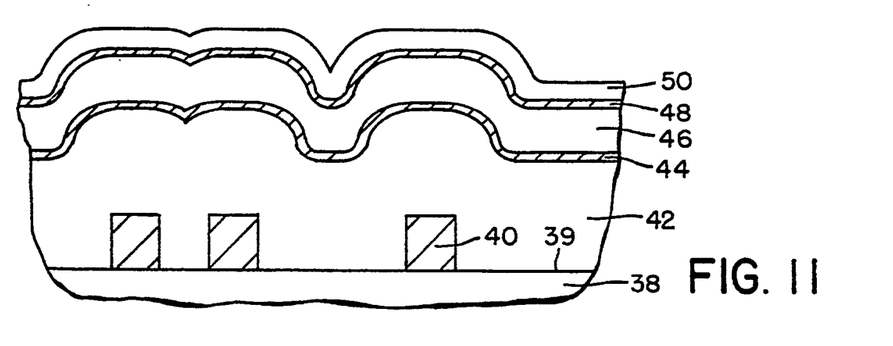
FIG. 11 is a cross-section side elevational view of an initial structure according to a further embodiment of the subject invention.

Referring to FIG. 11, the tungsten-interlevel dielectric starting structure is shown to include a semiconductor substrate 38 upon the surface 39 of which are located metal lines 40. The structure further consists of several alternating hard and soft materials, including sequentially from top to bottom: an approximately 200 nm of soft polishing dielectric 50, a hard polishing material 48 (about 200 nm), about 760 nm of soft polishing dielectric 46, and about 80 nm of hard polishstop 44 overlying roughly 1800 nm of interlevel dielectric 42. For some applications, the final hard polishstop 44 and interlevel dielectric 42 may be combined into one layer, provided the material polishes significantly slower than the other soft polishing dielectric material above it 46.

Figure 12:
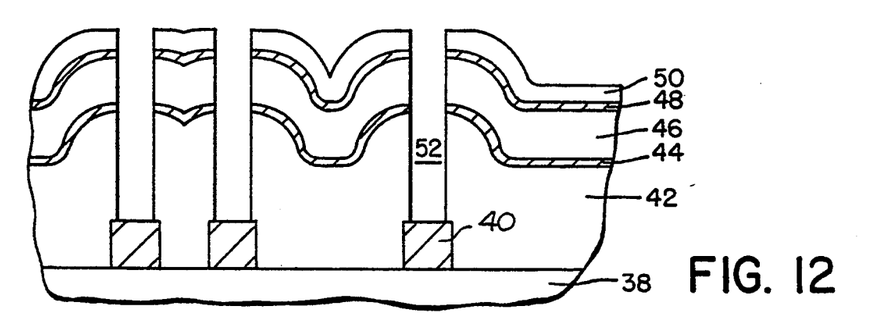
FIG. 12 is a cross-section side elevation view of the structure shown in FIG. 11 after photolithography and via etch.

After deposition of the alternating hard and soft layers, vias 52 are etched as shown in FIG. 12. Because the vias 52 are all on the same level, all etch distances are approximately the same and a severe overetch is not necessary. A 1:1 dielectric:silicon nitride via etch presents no current technical problems.

Figure 13:
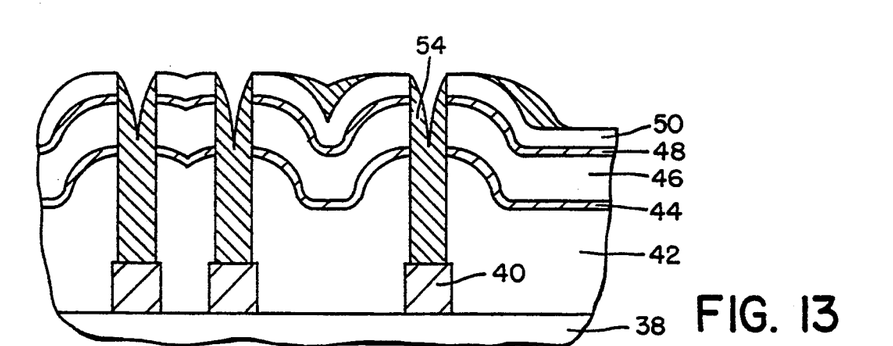
FIG. 13 is a cross-section side elevational view of the structure shown in FIG. 12 after tungsten deposition and etchback.
Figure 14:
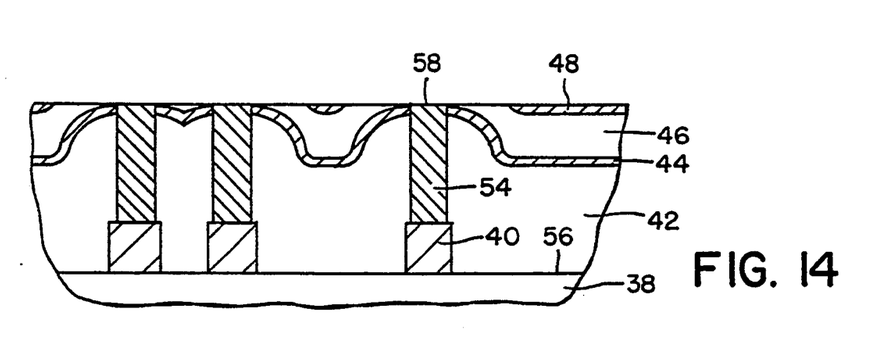
FIG. 14 is a cross-section side elevational view of the structure shown in FIG. 13 after polishing which removes the upper dielectric, eliminating tungsten puddling and providing a polishstop.

Next, tungsten 54 is deposited and etched back, filling the majority of the vias 52, leaving no more than a 1200 nm seam, as shown in FIG. 13. The structure is then polished as illustrated in FIG. 14. With the addition of 200 nm of dielectric above 200 nm of polishstop, tungsten puddling will be eliminated. This dielectric essentially holds any residual tungsten up above the polishstop, and allows for the easy and complete removal of the tungsten. The sequence of polishstops will allow for improved planarity over current simple oxide polishing and for a significant overpolish.

As a working example, the following materials can be used: the slowly polishing materials will be silicon nitride and the top two dielectrics will be PSG and the lower interlevel dielectric will be silicon dioxide.

The invention thus provides for the addition of a polishstop layer and an upper dielectric layer, which makes the process more controllable but also solves many inherent problems with current art such as allowing for an extended range of polishing planarity, ending tungsten puddling, and ending "China Syndrome". The invention also results in considerable process savings by eliminating two processing steps and by developing a larger process window.

While the invention has been particularly shown and described with reference to preferred embodiments thereof, it will be understood by those skilled in the art that various changes in form and details may be made therein without departing from the spirit and scope of the invention.

We claim:

1. A method for producing a substantially planar surface overlying features of a semiconductor structure, which method comprises:
   forming alternating layers of a hard polishing material and a soft polishing material over features of a semiconductor structure, said features including raised and recessed portions, wherein said alternating layers comprise a conformal first layer of a hard polishing material overlying said features of said semiconductor structure, a conformal second layer of a soft polishing material overlying said first layer of a hard polishing material, and a conformal third layer of a hard polishing material overlying said second layer of a soft polishing material, and wherein said first layer comprises silicon dioxide, said second layer comprises phosphosilicate glass, and said third layer comprises silicon nitride; and
   polishing said alternating layers so as to create a substantially planar surface over said features.

2. A method for producing a substantially planar surface overlying features of a semiconductor structure, which method comprises:
   forming alternating layers of a hard polishing material and a soft polishing material over features of a semiconductor structure, said features including raised and recessed portions, wherein said alternating layers comprise:
      a conformal first layer of a hard polishing material overlying said features of said semiconductor structure;
      a conformal second layer of a soft polishing material overlying said first layer of a hard polishing material;
      a conformal third layer of a hard polishing material overlying said second layer of a soft polishing material;
      a conformal fourth layer of a soft polishing material overlying said third layer of a hard polishing material; and
      a conformal fifth layer of a hard polishing material overlying said fourth layer of a soft polishing material; and
   polishing said alternating layers so as to create a substantially planar surface over said features.

3. The method of claim 2 wherein said first layer comprises silicon dioxide, said second and fourth layers each comprise phosphosilicate glass, and said third and fifth layers each comprise silicon nitride.

4. The method of claim 2 wherein said polishing comprises:
   polishing said fifth layer to reveal said fourth layer;
   polishing said fourth layer positioned over said raised portions so as to reveal said third layer positioned over said raised portions;
   removing said third layer positioned over said raised portions so as to reveal said second layer positioned over said raised portions; and
   polishing said fourth layer positioned over said recessed portions so as to reveal said third layer positioned over said recessed portions, and polishing said second layer positioned over said raised portions to reveal said first layer positioned over said raised portions,
   wherein said third layer positioned over said recessed portions and said first layer positioned over said raised portions form the substantially planar surface over said features.

5. The method of claim 4 wherein removing said third layer comprises etching selective for said third layer.

6. The method of claim 4 further comprising removing said third layer positioned over said recessed portions so as to reveal said second layer positioned over said recessed portions, wherein said second layer positioned over said recessed portions and said first layer positioned over said raised portions form the substantially planar surface over said features.

7. The method of claim 6 wherein removing said third layer comprises etching selective for said third layer or polishing said third layer.

8. A method for producing a substantially planar surface overlying features of a semiconductor structure, which method comprises:
   forming alternating layers of a hard polishing material and a soft polishing material over features of a semiconductor structure, said features including raised and recessed portions, wherein said alternating layers comprise:
      a conformal first layer of a hard polishing material overlying said features of said semiconductor structure;
      a conformal second layer of a soft polishing material overlying said first layer of a hard polishing material; and
      a conformal third layer of a hard polishing material overlying said second layer of a soft polishing material; and
   polishing said alternating layers so as to create a substantially planar surface over said features, wherein said polishing comprises:
      polishing said third layer positioned over said raised portions so as to reveal said second layer positioned over said raised portions; and
      polishing said second layer positioned over said raised portions so as to reveal said first layer positioned over said raised portions,
      wherein said third layer positioned over said recessed portions and said first layer positioned over said raised portions form the substantially planar surface over said features.

9. The method of claim 8 further comprising polishing said third layer positioned over said recessed portions so as to reveal said second layer positioned over said recessed portions, wherein said second layer positioned over said recessed portions and said first layer positioned over said raised portions form the substantially planar surface over said features.

10. A method for producing a substantially planar surface overlying features of a semiconductor structure, which method comprises:

sequentially, in an unbroken sequence, forming alternating layers of a hard polishing material and a soft polishing material over features of a semiconductor structure, said features including raised and recessed portions, wherein said alternating layers comprise:
- a conformal first layer of a soft polishing material overlying said features of said semiconductor structure;
- a conformal second layer of a hard polishing material overlying said first layer of a soft polishing material;
- a conformal third layer of a soft polishing material overlying said second layer of a hard polishing material;
- a conformal fourth layer of a hard polishing material overlying said third layer of a soft polishing material; and
- a conformal fifth layer of a soft polishing material overlying said fourth layer of a hard polishing material; and polishing said sequentially formed alternating layers so as to create a substantially planar surface over said features.

11. A method for producing a substantially planar surface overlying features of a semiconductor structure, which method comprises:

forming alternating layers of a hard polishing material and a soft polishing material over features of a semiconductor structure, said features including radioed and recessed portions, wherein said alternating layers comprise:
- a conformal first layer of a soft polishing material overlying said features of said semiconductor structure;
- a conformal second layer of a hard polishing material overlying said first layer of a soft polishing material;
- a conformal third layer of a soft polishing material overlying said second layer of a hard polishing material;
- a conformal fourth layer of a hard polishing material overlying said third layer of a soft polishing material;
- a conformal fifth layer of a soft polishing material overlying said fourth layer of a hard polishing material; and
- a conformal sixth layer of a hard polishing material overlying said fifth layer of a soft polishing material; and polishing said alternating layers so as to create a substantially planar surface over said features.

12. The method of claim 11 wherein said polishing comprises:
polishing said sixth layer to reveal said fifth layer;
polishing said fifth layer positioned over said raised portions so as to reveal said fourth layer positioned over said raised portions;
removing said fourth layer positioned over said raised portions so as to reveal said third layer positioned over said raised portions; and
polishing said fifth layer positioned over said recessed portions so as to reveal said fourth layer positioned over said recessed portions, and polishing said third layer positioned over said raised portions to reveal said second layer positioned over said raised portions,
wherein said fourth layer positioned over said recessed portions and said second layer positioned over said raised portions form the substantially planar surface over said features.

13. The method of claim 12 wherein removing said fourth layer comprises etching selective for said fourth layer.

14. The method of claim 12 further comprising removing said fourth layer positioned over said recessed portions so as to reveal said third layer positioned over said recessed portions, wherein said third layer positioned over said recessed portions and said second layer positioned over said raised portions form the substantially planar surface over said features.

15. The method of claim 14 wherein removing said fourth layer comprises etching selective for said fourth layer or polishing said fourth layer.

16. A method for producing a substantially planar surface overlying features of a semiconductor structure, which method comprises:

forming alternating layers of a hard polishing material and a soft polishing material over features of a semiconductor structure, said features including raised and recessed portions, wherein said alternating layers comprise:
- a conformal first layer of a soft polishing material overlying said features of said semiconductor structure;
- a conformal second layer of a hard polishing material overlying said first layer of a soft polishing material;
- a conformal third layer of a soft polishing material overlying said second layer of a hard polishing material; and
- a conformal fourth layer of a hard polishing material overlying said third layer of a soft polishing material; and polishing said alternating layers so as to create a substantially planar surface over said features, wherein said polishing comprises:
polishing said fourth layer positioned over said raised portions so as to reveal said third layer positioned over said raised portions; and
polishing said third layer positioned over said raised portions so as to reveal said second layer positioned over said raised portions;
wherein said fourth layer positioned over said recessed portions and said second layer positioned over said raised portions form the substantially planar surface over said features.

17. The method of claim 16 further comprising removing said fourth layer positioned over said recessed portions so as to reveal said third layer positioned over said recessed portions, wherein said third layer positioned over said recessed portions and said first layer positioned over said raised portions form the substantially planar surface over said features.

18. The method of claim 17 wherein removing said fourth layer comprises etching selective for said fourth layer or polishing said fourth layer.

19. The method of claim 1, 2, 8, 10, 11 or 16 wherein a via is etched in said alternating layers prior to polishing said alternating layers.

20. The method of claim 19 wherein said via is filled with tungsten.

21. The method of claim 1, 2, 8, 10, 11 or 16 wherein said polishing process comprises chemical mechanical polishing.

22. The method of claim 2, 8, 10, 11 or 16 wherein said hard polishing material is selected from the group consisting of silicon nitride, silicon carbide, diamond like carbon, alumina, tungsten, and silicon dioxide.

23. The method of claim 2, 8, 10, 11 or 16 wherein said soft polishing material comprises a dielectric.

24. The method of claim 23 wherein said dielectric is selected from the group consisting of silicon dioxide, phosphosilicate glass, borophosphosilicate glass, sputtered quartz and polyimide.

* * * * *

UNITED STATES PATENT AND TRADEMARK OFFICE
CERTIFICATE OF CORRECTION

PATENT NO. : 5,356,513
DATED : October 18, 1994
INVENTOR(S) : Burke et al.

It is certified that error appears in the above-indentified patent and that said Letters Patent is hereby corrected as shown below:

In claim 11, at column 11, line 40, delete "radioed" and insert --raised--.

Signed and Sealed this

Second Day of May, 1995

Attest:

BRUCE LEHMAN

*Attesting Officer*    *Commissioner of Patents and Trademarks*